United States Patent [19]
Paik et al.

[11] Patent Number: 5,879,964
[45] Date of Patent: Mar. 9, 1999

[54] METHOD FOR FABRICATING CHIP SIZE PACKAGES USING LAMINATION PROCESS

[75] Inventors: Kyung Wook Paik; Se Young Jang, both of Taejeon, Rep. of Korea

[73] Assignee: Korea Advanced Institute of Science and Technology, Taejeon, Rep. of Korea

[21] Appl. No.: 105,055

[22] Filed: Jun. 26, 1998

[30] Foreign Application Priority Data

Jul. 7, 1997 [KR] Rep. of Korea ................... 1997-31375

[51] Int. Cl.$^6$ ................................... H01L 21/44
[52] U.S. Cl. ............................ 438/113; 438/107
[58] Field of Search ................... 438/113, 107, 438/114, 460, 464, 465

[56] References Cited

U.S. PATENT DOCUMENTS

| | | | |
|---|---|---|---|
| 5,070,040 | 12/1991 | Pankove | 438/113 |
| 5,126,286 | 6/1992 | Chance | 438/113 |
| 5,786,237 | 7/1998 | Cockerill et al. | 438/113 |

*Primary Examiner*—Kevin M. Picardat
*Attorney, Agent, or Firm*—Hickman & Martine, LLP

[57] ABSTRACT

A method for fabricating chip size packages which uses a lamination process, thereby not only achieving an improvement in the reliability of final electronic products, a reduction in the manufacturing costs, and a mass production resulting in a high marketability, but also being applicable to the fabrication of packages for both memory and non-memory chips and enabling the final electronic products to have high electronic performance while making the package size of the final electronic products not greater than 1.2 times the semiconductor chip size. The method includes the steps of cutting a wafer into a plurality of wafer strips each having several dies, arranging the wafer strips on an adhesive-coated polymer film supported by an annular frame in such a manner that they are aligned with each other while being uniformly spaced from one another, bonding the aligned wafer strips to the polymer film in accordance with a lamination process, forming a polymer dam made of an epoxy-based polymer on the polymer film around a wafer region, forming an encapsulant encapsulating the wafer strips, forming a double laminated polymer film to encapsulate the chips as an alternative encapsulation method, forming via holes at positions respectively corresponding to pads of chips through the polymer film, forming an array of I/O pads for the chips, fusing solder balls to the I/O pads, and cutting several ten dies integrally formed in one lot into separate packages.

1 Claim, 5 Drawing Sheets

METHOD FOR FABRICATING CHIP SIZE PACKAGES USING LAMINATION PROCESS

BACKGROUND OF THE INVENTION

1. Field of the Invention

The present invention relates to a method for fabricating packages adapted to appropriately arrange semiconductor packages and to appropriately couple them while protecting them, and more particularly to a method for fabricating chip size packages using a lamination process.

2. Description of the Prior Art

Packaging techniques are techniques widely used for fabricating a variety of systems, which techniques involve the entire process from the fabrication of semiconductor devices to the manufacture of final products using the fabricated semiconductor devices.

Recently, semiconductor techniques have been rapidly developed. In particular, such semiconductor techniques have been developed to a degree capable of obtaining an integration of one million cells or more, an increase in the number of I/O pins in the case of non-memory devices, an increase in die size, an increased heat discharge ability, and a high electrical performance. However, electronic packaging techniques used to package semiconductor devices have been slowly developed, as compared to the rapid developments in the semiconductor techniques.

Electronic packaging techniques are important in determining the performance, size, costs and reliability of final electronic products. In particular, super-micro packages are essential elements for recently developed electronic appliances, such as computers, data communication systems, mobile communication systems and high-grade home appliances, configured to ensure a high electrical performance, super-micro/highly dense structure, low power consumption, multiple functions, super-high signal processing, and permanent reliability.

For example, the application of chip size packages, which are a kind of such super-micro packages, is extended to PC cards, card-size personal computers, compact global position system receivers, camcorders, personal digital assistants, notebook computers, and telephone handsets.

Such chip size packages include lead-on-chip (LOC) type chip size packages adapted to package memory chips and micro ball grid array (BGA) type chip size packages adapted to package non-memory chips. LOC chip size packages are mainly used for packages of a 16 Mega grade or greater. Micro BGA chip size packages are fabricated using a combination of a BGA technique using solder balls and a chip size packaging technique. In addition, there are a variety of chip size packaging techniques for packaging non-memory chips. However, there is no specified standard for chip size packaging techniques.

U.S. Pat. No. 5,293,067 discloses an "integrated circuit chip carrier" used to fabricate semiconductor packages. In accordance with this patent, a patterned package carrier is first fabricated. A semiconductor chip is mounted on the patterned package carrier by means of solder balls, thereby fabricating a semiconductor package. However, this technique requires complicated processes because a solder ball forming process is used twice in accordance with the patent. Furthermore, this technique exhibits very low reliability because the chip is exposed. In addition, the required processes are expensive. This results in a difficulty in mass production and a very low marketability.

SUMMARY OF THE INVENTION

Therefore, an object of the invention is to provide a method for fabricating chip size packages which uses a lamination process, thereby not only achieving an improvement in the reliability of final electronic products by reducing stress generated at the package, a reduction in the manufacturing costs, and a mass production resulting in a high marketability, but also being applicable to the fabrication of packages for both memory and non-memory chips and enabling the final electronic products to have high electronic performance while making the package size of the final electronic products not greater than 1.2 times the semiconductor chip size.

In accordance with the present invention, this object is accomplished by providing a method for fabricating chip size packages, comprising the steps of: cutting a wafer, on which desired circuit patterns have been formed, into a plurality of wafer strips each having several dies, using a diamond saw; arranging the wafer strips on a adhesive-coated polymer film supported by an annular frame in such a manner that they are aligned with each other while being uniformly spaced from one another by about 5 mm and in such a manner that the upper surface of each wafer strip faces the surface of the polymer film opposite to the annular frame; bonding the aligned wafer strips to the polymer film in accordance with a lamination process; forming a polymer dam made of an epoxy-based polymer on the surface of the polymer film, to which the wafer strips are bonded, around a wafer region where the wafer strips are disposed, filling an epoxy-based polymer in the wafer region defined by the polymer dam, thereby forming an encapsulant encapsulating the wafer strips, and curing the encapsulant; or instead of the encapsulation method, laminating another layer of polymer film at the backside of the wafer strips to encapsulate the chips; forming via holes at positions respectively corresponding to pads of chips through the polymer film, forming a solderable Ti/Ni/Cu metal thin film over the polymer film, forming a photoresist film over the metal thin film, patterning the photoresist film, and patterning the metal thin film while using the patterned photoresist film as a mask, thereby forming an array of I/O pads for the chips; coating a flux on the I/O pads, arranging solder balls on the I/O pads, respectively, fusing the solder balls to the associated I/O pads using a solder reflow oven, and removing the flux using an organic solvent; and cutting several ten dies integrally formed in one lot into separate packages.

In accordance with the method of the present invention, a general polymer film is used as a carrier for chips. The polymer film is attached to chips using stress reducing thermoplastic adhesive which are, in turn, reinforced by either an epoxy-based encapsulant or another laminated polymer film at the backside of the wafer strips. The method of the present invention involves only one single solder ball forming process while involving no solder ball forming and flip-chip under-filling processes required in association with flip-chip bonding of the package carrier as described in the prior art, for example, U.S. Pat. No. 5,293,067. That is, the present invention provides a chip size package fabricating method capable of achieving a simpler and less expensive package fabrication because of eliminating flip-chip and attach processes, and an improvement in the reliability because of using stress relaxable adhesive layer during lamination process. It is also possible to fabricate packages having a considerably reduced size and exhibiting a superior electrical performance by applying multilayer laminated polymer film structure on chips, as compared to those fabricated in accordance with conventional QFP and BGA methods.

BRIEF DESCRIPTION OF THE DRAWINGS

Other objects and aspects of the invention will become apparent from the following description of embodiments with reference to the accompanying drawings in which:

FIGS. 1 to 6 are views respectively illustrating sequential steps of a method for fabricating chip size packages in accordance with the present invention, wherein FIG. 1 is a plan view illustrating a finally processed wafer cut into wafer strips each having 4 to 6 dies;

FIG. 2 is a plan view illustrating the condition in which the cut wafer strips are arranged on a polymer film;

FIG. 3 is a plan view illustrating the condition in which the wafer strips are bonded to the polymer film in accordance with a lamination process while being encapsulated by an encapsulant formed on a wafer region defined by a polymer dam;

FIG. 4 is a plan view illustrating the condition in which an array of I/O pads having the form of a lattice is formed on a patterned metal thin film formed on the polymer film having via holes;

FIG. 5 is a plan view illustrating the condition in which solder balls are fused to the I/O pads;

FIG. 6 is an enlarged plan view illustrating a chip size package obtained after cutting the wafer strips formed with solder balls into separate dies.

DESCRIPTION OF THE PREFERRED EMBODIMENTS

Referring to FIGS. 1 to 6, a method for fabricating chip size packages using a lamination process in accordance with the present invention is illustrated, respectively.

The method of the present invention includes 10 processing steps as follows.

[First Step]

Figure 1:
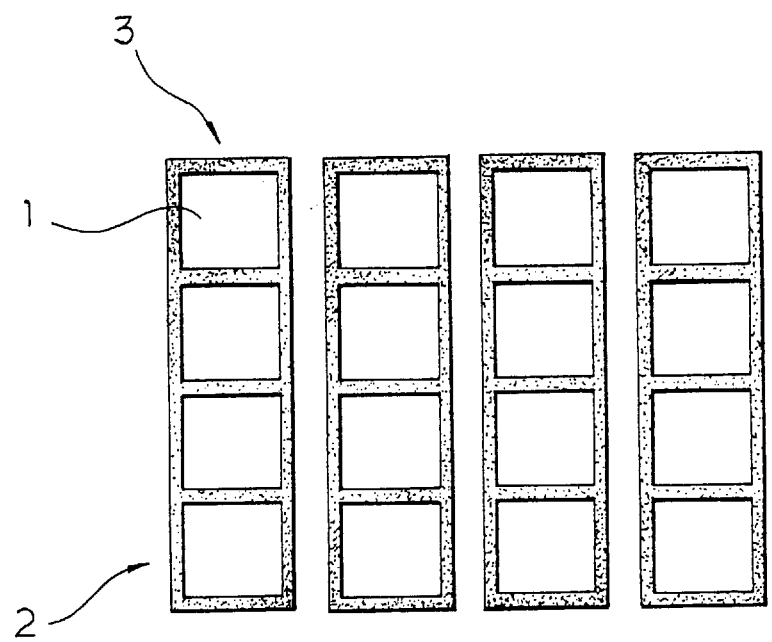

A wafer, on which desired circuit patterns have been formed, is cut into a plurality of wafer strips 2 each having several dies 1, for example, 4 to 6 dies, using a diamond saw, as shown in FIG. 1.

[Second Step]

Figure 2:
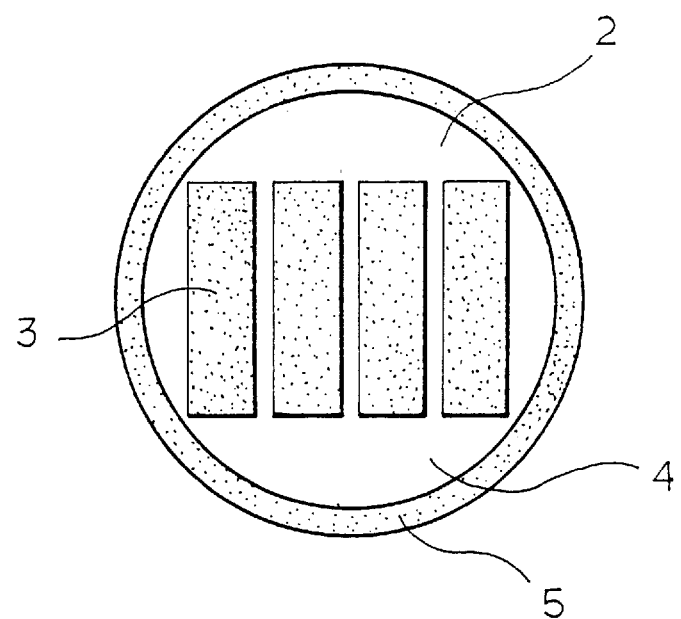

A polyimide film 4 is then attached to an annular metal frame 5 by means of a thermoplastic adhesive coated over the annular frame 5, as shown in FIG. 2. In FIG. 2, the reference numeral 3 denotes the backside of the wafer strip.

Thereafter, a thermoplastic adhesive is spin-coated over the surface of the film 4. The resulting structure is then subjected to a heat treatment, thereby removing a solvent existing in the adhesive.

[Third Step]

The wafer strips 2 obtained at the first step are then arranged on the film 4 supported by the annular frame 5 in such a manner that they are aligned with each other while being uniformly spaced from one another by about 5 mm, using a pick-and-place machine. The arrangement wafer strips 2 are carried out in such a manner that the upper surface of each wafer strip faces the surface of the film 4 opposite to the annular frame 5.

At this step, heat sinks may be attached to the backside of the wafer, if it is required to provide a heat discharge function.

[Fourth Step]

The resulting structure, in which the wafer strips 2 are aligned together on the film 4 supported by the annular frame 5, is then subjected to a lamination process, thereby bonding the wafer to the film 4. The lamination process is carried out at controlled lamination temperature and pressure in order to prevent the wafer from being damaged.

[Fifth Step]

Figure 3:
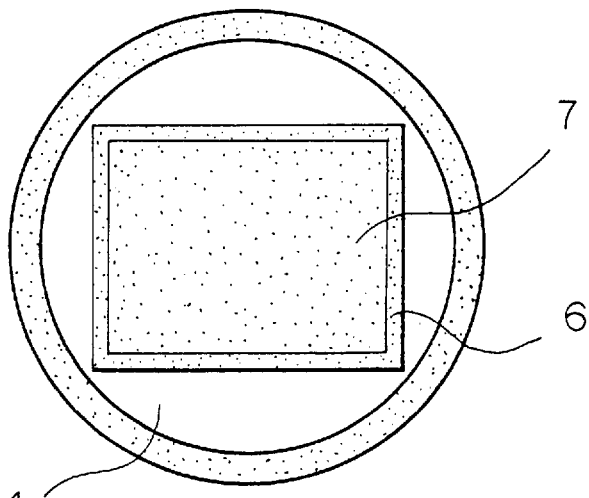

As shown in FIG. 3, a polymer dam 6 made of an epoxy-based polymer exhibiting a high viscosity is formed on the surface of the film 4, to which the wafer strips are bonded, around a wafer region where the wafer strips are disposed. An epoxy-based polymer exhibiting a low viscosity is then filled in the wafer region defined by the polymer dam 6, thereby forming an encapsulant 7 encapsulating the wafer strips and having a desired thermal expansion coefficient. Thereafter, the encapsulant 7 is completely cured. In some cases, an epoxy molding process may be used in place of such an encapsulation process.

Figure 3A:
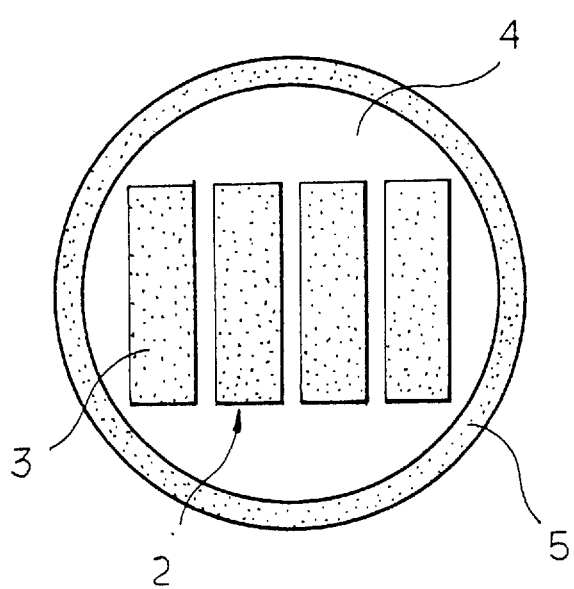
FIGS. 3a and 3b are plan and cross-sectional views of alternative methods of encapsulation illustrating the condition in which both sides of wafer strips are bonded to the polymer film with a lamination process.
Figure 3B:
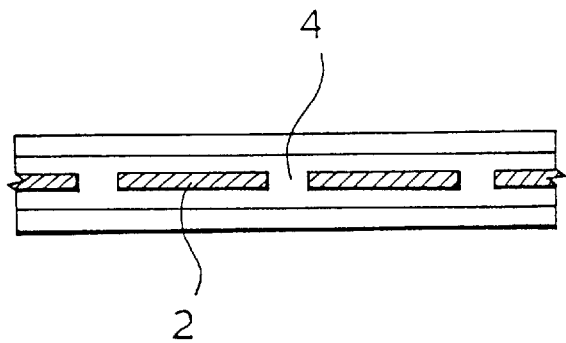

As an alternative to the encapsulation method shown in FIG. 3, FIG. 3a describes both side lamination method to encapsulate the wafer strips. After the first lamination of the front side of wafer strips, the backside of wafer strips is laminated using another adhesive coated polyimide film 4 with an annular metal frame 5. FIG. 3b shows a cross-sectional view of double laminated strips.

[Sixth Step]

The wafer structure formed using the encapsulation or double lamination process is then cut out from the frame. Subsequently, via holes 8 are perforated at positions respectively corresponding to pads of chips through the film 4 left on the wafer structure in accordance with a reactive ion etching (RIE) method or a laser method using a mask. Preferably, the via holes 8 has a slope of about 75° in order to achieve an easy metal thin film deposition to be subsequently carried out.

[Seventh Step]

A metal thin film is then formed over the film 4 in which the via holes 8 are formed.

Figure 4:
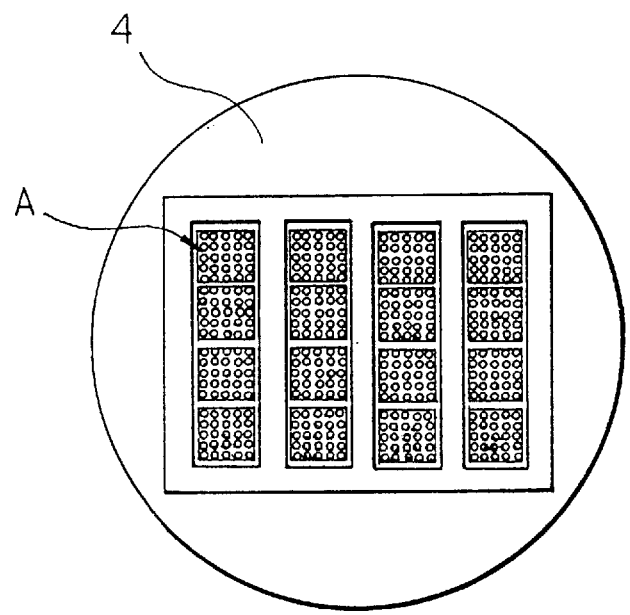
Figure 4A:
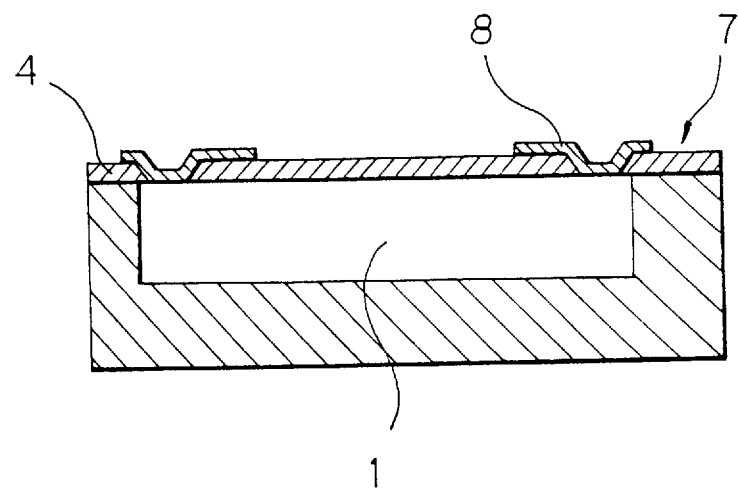
FIG. 4a is a cross-sectional view taken along the line A of FIG. 4.

Over the metal thin film, a solderable 1,000 Å Ti/0.3–1 $\mu$m Ni/1–5 $\mu$m Cu metal layer adapted to bond lead/tin solders thereon is then formed. Thereafter, a photoresist film is formed over the metal layer and then patterned. Using the patterned photoresist film as a mask, the metal layer is patterned to form an array of I/O pads. The array of I/O pads has the form of a lattice-shaped area array. This step is shown in FIGS. 4 and 4a.

[Eighth Step]

A flux is then coated on the I/O pads arranged in the form of a lattice. Thereafter, solder balls 9 having a diameter of about 100 to 500 microns are arranged on the I/O pads, respectively, using a solder ball arranging machine.

[Ninth Step]

Figure 5:
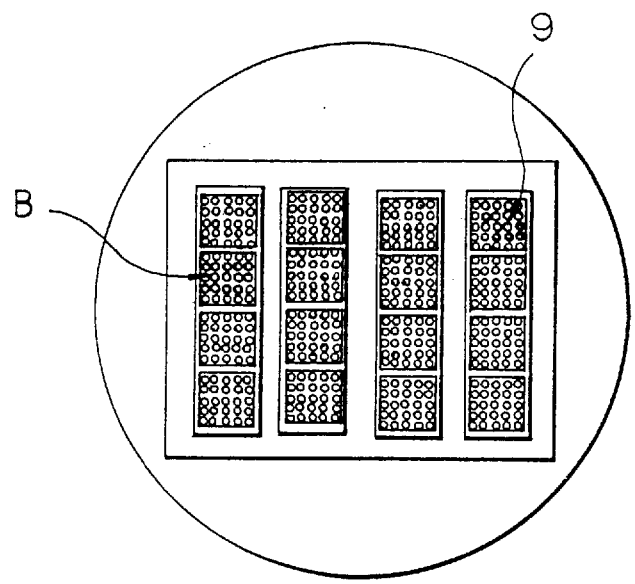
Figure 5A:
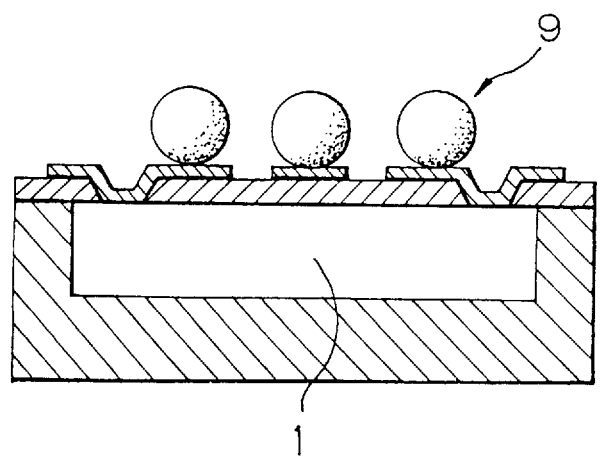
FIG. 5a is a cross-sectional view taken along the line B of FIG. 5.

The solder balls 9 are then fused to the associated I/O pads using a solder reflow oven. At this time, the reflow temperature and atmosphere are controlled to form solder balls having a completely spherical shape. The thermomechanical stress generated during heating and cooling can be absorbed by a laminating thermoplastic adhesive. After completing the fusing step, the flux is removed using an organic solvent. This step is shown in FIGS. 5 and 5a.

[Tenth Step]

Figure 6:
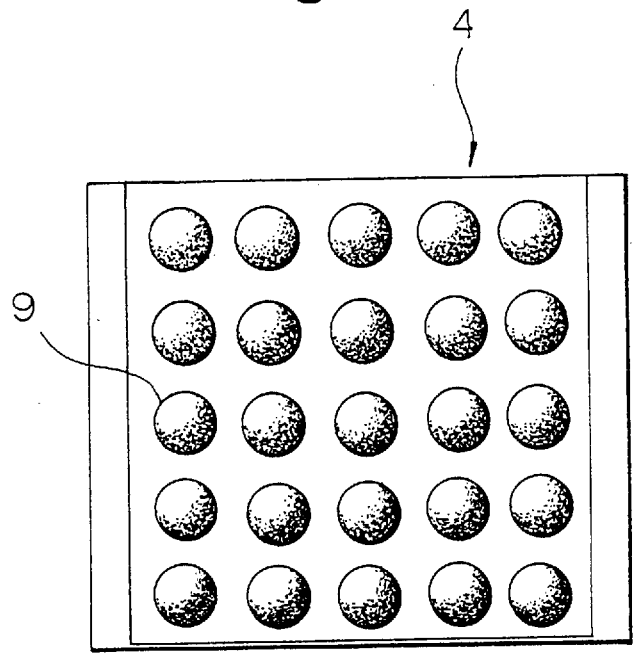
Figure 6A:
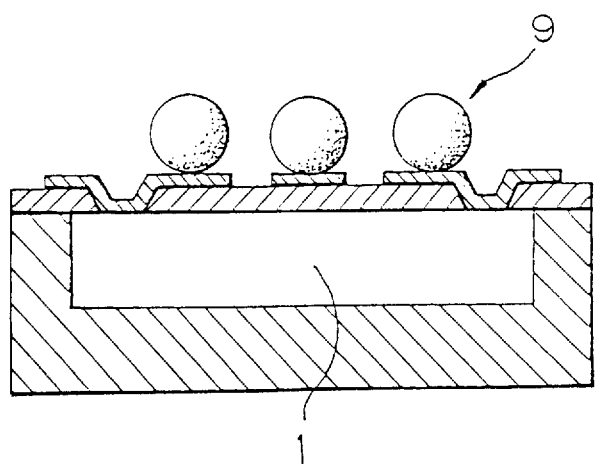
FIG. 6a is a cross-sectional view of FIG. 6.

The backside of the resulting epoxy encapsulated structure is then polished to obtain a desired smoothness. In case of the double lamination processed samples, polishing process is unnecessary. Several wafer strips integrally formed in one lot are cut into separate packages. The cutting is carried out using a wafer dicing saw. This step is shown in FIGS. 6 and 6a.

For fabricating chip size packages, the method of the present invention does not use separate unit chips, but uses several wafer strips each including 4 to 6 pretested chips. These wafer strips are bonded to a thermoplastic adhesive-coated polymer film in such a manner that the upper surface of each chip is attached to the polymer film. The polymer film is used as an insulator for chips and a base to which solder balls are fused. A thermoplastic adhesive is used to reduce the thermo-mechanical stress generated at the package.

In accordance with the present invention, it is essentially required to process the surface of the polymer film, on which a thermoplastic adhesive is to be coated, using reactive gas plasma before the coating of the adhesive, so as to enhance the bonding force of the adhesive. In order to mechanically reinforce the backside of each chip, an epoxy encapsulant or mold is formed to cover the backside of the chip. Alternatively, a polymer film may be attached to the backside of the chips. For such a reinforcement adapted to reinforce the backside of the chips, a material exhibiting a low thermal expansion coefficient is used to reduce thermal stress generated between the reinforcement and chips.

Preferably, the metal layer formed at the seventh step has a multilayer structure consisting of Ti/Ni/Cu. In particular, it is desirable for the Ni layer to have a thickness of 0.3 to 1 $\mu$m and for the Cu layer to have a thickness of 1 to 5 $\mu$m, in order to obtain a stability of eutectic solder balls which are subsequently fused to the metal layer.

As apparent from the above description, in accordance with the present invention, a general polymer film is used as a carrier for chips. The polymer film is attached to chips which are, in turn, reinforced by an epoxy-based encapsulant or a laminated film. That is, the present invention provides a chip size package fabricating method capable of achieving a simple and inexpensive package fabrication and an improvement in the reliability. Furthermore, chip size packages fabricated in accordance with the method of the present invention has a structure having a very small interconnection length, thereby exhibiting a minimized signal delay and a minimized noise generation. This results in a superior electrical performance.

Since the method of the present invention fabricates chip size packages using a lamination process and an encapsulation or double lamination process, it enables a simple and inexpensive package fabrication. And the reliability of this package can be significantly improved by the stress reducing effect of the thermoplastic adhesive. It is also possible to fabricate packages having a considerably reduced size and exhibiting a superior electrical performance, as compared to those fabricated in accordance with conventional QFP and BGA methods.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating chip size packages, comprising the steps of:

cutting a wafer, on which desired circuit patterns have been formed, into a plurality of wafer strips each having several dies, using a diamond saw;

arranging the wafer strips on a stress reducing thermoplastic adhesive-coated polymer film supported by an annular frame in such a manner that they are aligned with each other while being uniformly spaced from one another by about 5 mm and in such a manner that the upper surface of each wafer strip faces the surface of the polymer film opposite to the annular frame;

bonding the aligned wafer strips to the polymer film in accordance with a lamination process;

forming a polymer dam made of an epoxy-based polymer on the surface of the polymer film, to which the wafer strips are bonded, around a wafer region where the wafer strips are disposed, filling an epoxy-based polymer in the wafer region defined by the polymer dam, thereby forming an encapsulant encapsulating the wafer strips, and curing the encapsulant;

forming a double laminated polymer film to encapsulate the chips as an alternative encapsulation method;

forming via holes at positions respectively corresponding to pads of chips through the polymer film, forming a solderable Ti/Ni/Cu metal thin film over the polymer film, forming a photoresist film over the solderable metal thin film, patterning the photoresist film, and patterning the metal thin film while using the patterned photoresist film as a mask, thereby forming an array of I/O pads for the chips;

coating a flux on the I/O pads, arranging solder balls on the I/O pads, respectively, fusing the solder balls to the associated I/O pads using a solder reflow oven, and removing the flux using an organic solvent; and polishing the backside of the resulting epoxy encapsulated structure, and cutting several ten dies integrally formed in one lot into separate packages.

\* \* \* \* \*